United States Patent [19]

Takada et al.

[11] Patent Number: 5,061,687

[45] Date of Patent: Oct. 29, 1991

[54] LAMINATED FILM AND METHOD FOR PRODUCING THE SAME

[75] Inventors: Toshio Takada; Takahito Terashima; Kenji Iijima; Kazunuki Yamamoto; Kazuto Hirata, all of Kyoto, Japan

[73] Assignees: Ube Industries, Ltd., Ube; Kanegafuchi Chemical Industry Co., Ltd., Osaka; Nippon Steel Corporation; TDK Corporation, both of Tokyo; Tosoh Corporation, Shin nanyo; Toyo Boseki Kabushiki Kaisha, Osaka; Nippon Mining Co., Ltd.; NEC Corporation, both of Tokyo; Matsushita Electric Industrial Co., Ltd., Kadoma; Seisan Kaihatsu Kagaku Kenkyusho, Kyoto, all of Japan

[21] Appl. No.: 442,988

[22] Filed: Nov. 29, 1989

[30] Foreign Application Priority Data

Nov. 29, 1988 [JP] Japan .................................. 63-302510

[51] Int. Cl.$^5$ ................................................ B32B 9/00
[52] U.S. Cl. ........................................ 505/1; 505/701; 505/702; 505/703; 505/704; 428/426; 428/432; 428/433; 428/688; 428/689; 428/699; 428/700; 428/930
[58] Field of Search .................... 505/1, 701–704; 428/426, 432, 433, 688, 689, 699, 700, 901, 930

[56] References Cited

PUBLICATIONS

CA111 (22):207055c, J Appl Phys 66 (7) 3148–53, 1989, Tanabe et al.
Jap. Abs. 89/168373/23, Hitachi, 10-87.
Jap. Abs. 89-131562/18, Rogalla et al., 10-87.
CA 110 (8):67795w, Hons et al., Appl. Phys. Lett. 53(21) 2102–4.

*Primary Examiner*—Patrick Ryan
*Attorney, Agent, or Firm*—Wenderoth, Lind & Ponack

[57] ABSTRACT

A laminated film comprising a thin film of single crystal $YBa_2Cu_3O_{7-x}$ having the (001) plane in the direction parallel with the film surface and a continuous insulating ultrathin layer of MgO which is formed on said superconductor film and has a thickness of not larger than 10Å and the (001) plane in a direction parallel with the film surface is provided.

2 Claims, 3 Drawing Sheets

LAMINATED FILM AND METHOD FOR PRODUCING THE SAME

BACKGROUND OF THE INVENTION

1. Field of the Invention

The present invention relates to a laminated film and a method for producing the same. More particularly, the present invention relates a laminated film comprising a thin film of $YBa_2Cu_3O_{7-x}$ which is attractive as a superconductor exhibiting superconductivity around 90 K and an ultrathin layer of MgO formed on said superconductor layer and a method for producing the same.

2. Description of the Related Art

Superconductors including $YBa_2Cu_3O_{7-x}$ will find various new applications such as Josephson tunnelint junctions.

To product the Josephson tunneling junctions, an insulating ultrathin layer having a thickness of 30 Å or less should be formed between the superconductor films for tunnel junction. To form such junction, it is essential to produce a superconductive film having good surface smoothness and an insulating layer on it. A thickness of the insulating ultrathin layer for forming a junction is limited by a coherence length of a superconductor film. The coherent length in the direction perpendicular to the (001) plane is about 4 to 7 Å, while that in a direction parallel to said plane is about 15 to 30 Å.

Therefore, the thickness of the insulating ultrathin layer to be used for junction varies with a kind of the superconductor and its crystal direction to be connected. When a direction perpendicular to the (001) plane of the superconductor coincides with the direction perpendicular the surface of the insulating layer, the thickness of the latter should be 10 Å or less. On the contrary, when a direction parallel with the (001) plane of the superconductor coincides with the direction perpendicular to the surface of the insulating layer, the thickness of the latter can be as thick as several ten Å, which makes the formation of tunnel junction easy.

A thin film of single crystal $YBa_2Cu_3O_{7-x}$ having the (001) plane in a direction parallel with the film surface and its production are disclosed in co-pending U.S. Patent Application No. 07/247,261 filed on Sept. 21, 1989 and EP-A 0 308 869.

The study on epitaxial growth of (110) MgO on (110) NdBaCuO by sputtering was reported in the Preprint for 1988 Autumn 49th Meeting of the Society of Applied Physics, Japan, Vol. 1, page 106.

However, it is very difficult to form the insulating ultrathin layer on the high temperature superconductor film and it has not been possible to form a continuous insulating thin film having a thickness of several ten Å.

One of the reasons for the difficulty in the formation of continuous insulating thin film may be that the high temperature superconductor film as a substrate is hardly in the single crystal form and then it cannot be expected to epitaxially grow the insulating ultrathin layer on such superconductor film.

Various studies have been made on the formation of the insulating ultrathin film on the high temperature superconductor films but no continuous insulating ultrathin film has been formed.

Including the case of the above described epitaxial growth of (110) MgO on (110) NdBaCuO by spattering, the epitaxial growth of the crystal is realized in a small area but the grown single crystals scatter on the substrate, so that adjacent peripheral parts of the single crystals are not continuously connected each other as the thickness of the insulating layer is reduced.

SUMMARY OF THE INVENTION

One object of the present invention is to provide a continuous insulating MgO ultrathin layer formed on a film of single crystal $YBa_2Cu_3O_{7-x}$ having the (001) plane in a direction parallel with the film surface.

Another object of the present invention is to provide a method for producing a continuous insulating MgO ultrathin film on a film of single crystal $YBa_2Cu_3O_{7-x}$ having the (001) plane in a direction parallel with the film surface.

Accordingly, the present invention provides a laminated film comprising a thin film of single crystal $YBa_2Cu_3O_{7-x}$ having the (001) plane in the direction parallel with the film surface and a continuous insulating ultrathin layer of MgO which is formed on said superconductor film and has a thickness of not larger than 10 Å and the (001) plane in a direction parallel with the film surface. Preferably, the MgO ultrathin layer is in the form of single crystal.

The present invention further provides a method for producing the laminated film of the present invention, which method comprises evaporating Mg at such rate that the MgO layer is formed at a rate not larger than 2 Å/sec. in the presence of a very small amount of oxygen and depositing MgO on a film of single crystal $YBa_2Cu_3O_{7-x}$ formed on a substrate for deposition at a substrate temperature of lower than 500° C.

DETAILED DESCRIPTION OF THE INVENTION

Figure 1:
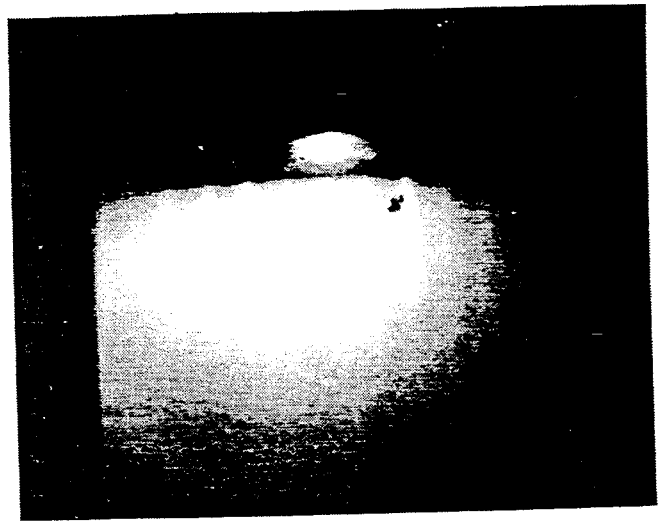
FIG. 1 is the reflection high energy electron diffraction (RHEED) photographs of the $YBa_2Cu_3O_{7-x}$ thin film of 1000 Å in thickness prepared in Example and FIGS. 2 through 5 are the RHEED photographs of the MgO layer prepared in Example at thicknesses of 3, 6, 9 and 1 Å, respectively.
Figure 2:
Figure 3:
Figure 4:
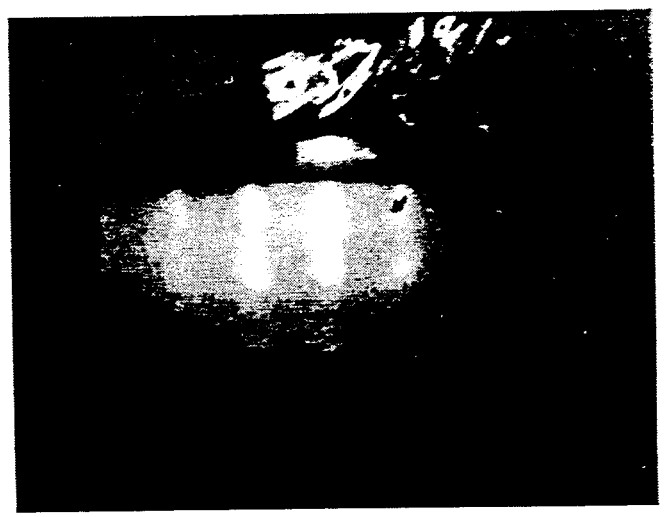
Figure 5:
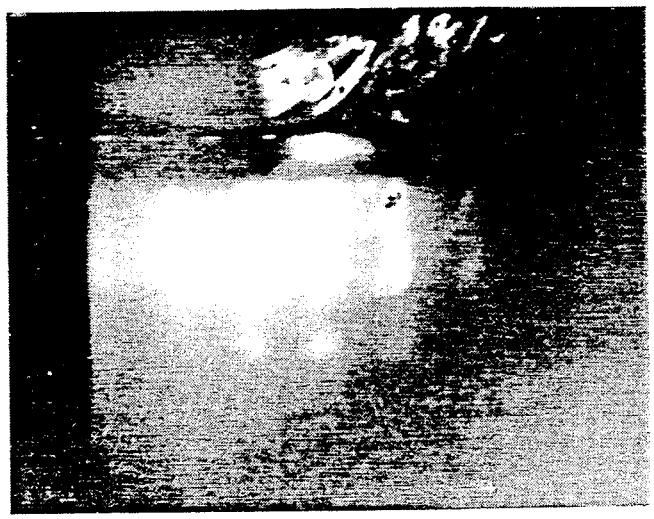

The laminated film of the present invention comprising the thin film of single crystal $YBa_2Cu_3O_{7-x}$ and the insulating ultrathin layer of MgO is preferably used for the fabrication of the Josephson tunnel type element, and the method of the present invention produces such laminated film.

The thin film of single crystal $YBa_2Cu_3O_{7-x}$ having the (001) plane in a direction parallel with the film surface is prepared by the method described in the above U.S. Patent Application Ser. No. 07/247,261 the disclosure of which is hereby incorporated by reference and EP-A 0 308 869, which method basically includes following two manner:

(a) Y, Ba and Cu are evaporated from independent evaporation sources in an atomic ratio of 1:2:3 on a substrate in a vacuum deposition vessel while supplying an oxygen gas from a distance close to the substrate to form an oxygen-containing atmosphere having a relatively high pressure at the substrate.

(b) Y, Ba and Cu are evaporated from discrete evaporation sources in an atomic ratio of 1:2:3 on a substrate in a vacuum deposition vessel and plasma is generated in the vessel while supplying an oxygen gas from a distance close to the substrate to form an oxygen-containing atmosphere having a relatively high pressure at the substrate.

To form the $YBa_2Cu_3O_{7-x}$ thin film by the above manner (a) or (b) in the single crystal form having the (001) plane in the direction parallel with the film surface, a substrate should be a single crystal having its (001) plane of which is parallel with its surface. Examples of the single crystal to be used as the substrate are single crystals of $SrTiO_3$, MgO, CoO, NiO and the like.

To obtain the $YBa_2Cu_3O_{7-x}$ thin film substantially the whole of which is in the single crystal form, the substrate is preferably heated to 500° C. or higher, more preferably 520° C. or higher.

The preparation of $YBa_2Cu_3O_{7-x}$ thin film of the present invention will be explained further in detail.

The vacuum deposition vessel is firstly evacuated to high vacuum of, for example, about $10^{-6}$ Torr. and then a small amount of the oxygen gas is continuously supplied towards the substrate from a distance close to the substrate to increase the pressure of oxygen at the substrate to $10^{-2}$ to $10^{-1}$ Torr while an interior gas in the vessel is continuously exhausted from a suitable part of the vessel to keep the background pressure at $10^{-5}$ to $10^{-3}$ Torr. in the vessel except near the substrate. The reason why the upper limit of the background is selected to be $10^{-3}$ Torr. is that Y, Ba and Cu in the evaporation sources are constantly evaporated without deterioration of evaporation rates. The lower limit of $10^{-5}$ Torr. is the minimum gas pressure for generating the plasma. If the plasma is not utilized, this lower limit is not technically important.

The reason why the oxygen gas pressure in increased only near the substrate in the above step is that Cu is not oxidized to $Cu^{+2}$ if the oxygen gas pressure is lower than $10^{-3}$ Torr.

The plasma can be generated by placing a high frequency coil between the evaporation sources and the substrate and oscillating it between the coil and the vessel wall at high frequency. While the plasma generation is preferred since the reaction activities of the evaporated metals are increased, it may have some drawbacks such that the plasma attacks the desired material which is being formed if the plasma energy is too high. Therefore, an electric power for generating the plasma is preferably in the range from 50 to 500 W, more preferably around 100 W.

Y and Ba are evaporated by electron beam and Cu is evaporated by electric resistance heating.

During evaporation of the metals by the above described evaporation means, the atomic ratio of Y, Ba and Cu is adjusted to about 1:2:3 by controlling the electric power according to results of preliminary experiments. Namely, in the preliminary experiment, how much metal Y, Ba or Cu is evaporated and how much oxide $Y_2O_3$, BaO or CuO is formed by the specific electric power applied to each evaporation source per unit time are measured by a film thickness measuring device installed in the vacuum evaporation vessel near the substrate for each metal. Thereby, a relationship between an evaporation rate of each metal and the applied electric power is established and then the electric power to be applied to each evaporation source during formation of the thin film of the $YBa_2Cu_3O_{7-x}$ single crystal is determined.

To epitaxially grow MgO on the single crystal $YBa_2Cu_3O_{7-x}$ thin film having the (001) plane in the direction parallel with the film surface, it may be contemplated to form the MgO layer under the same conditions as those for the formation of the $YBa_2Cu_3O_{7-x}$ thin film.

The experiments by the present inventors revealed that, if the substrate temperature is kept at a temperature of 500° C. or higher, especially 520° C. or higher during the formation of ultrathin layer of MgO, MgO cannot be homogeneously grown in the atomic layer unit. Under the above conditions for the formation of $YBa_2Cu_3O_{7-x}$ thin film, the MgO layer grows discontinuously, and only at the thickness of 30 Å or larger, a continuous MgO thin layer can be formed. This is the reason why the substrate temperature during the formation of MgO layer is selected to be lower than 500° C. As is seen from the results of below described Example, when the substrate temperature is suitable, the MgO ultrathin layer of a thickness of 2 to 3 atoms can be continuously formed. In the formed MgO ultrathin layer, not only its (001) plane is parallel with its surface, the whole of the layer is similar to the single crystal form. Therefore, on the MgO layer, good quality $YBa_2Cu_3O_{7-x}$ having the (001) plane in the direction parallel with the film surface can be epitaxially grown.

In the present invention, Mg is evaporated at such rate that the MgO is formed at a rate not larger than 2Å/sec. When the evaporation rate of Mg is larger than 2Å/sec., the MgO single crystal tends to grow discontinuously to form a discontinuous layer.

Evaporated Mg bonds with oxygen in the evaporation vessel to form MgO, which is deposited on the $YBa_2Cu_3O_7{-x}$ film. For the oxidation of Mg, the partially high pressure of oxygen is not required, and the oxygen pressure in the vessel is preferably kept around $10^{-4}$ Torr.

PREFERRED EMBODIMENTS OF THE INVENTION

The present invention will be illustrated by following Examples.

EXAMPLE 1

A vacuum vessel having a diameter of 750 mm and a height of 1000 mm was evacuated to $10^{-6}$ Torr. by an oil diffusion pump.

As a substrate, a surface polished single crystal piece of $SrTi_{O3}$ was used with a (001) plane forming a substrate surface (10 mm − 10 mm). The substrate was placed in the vacuum vessel and heated to 650° C. and kept at this temperature with a tungsten heater.

An oxygen injection nozzle was inserted in a doughnut shaped oxygen diffusion chamber surrounding the periphery of the substrate, and oxygen injected from the nozzle was once diffused in the chamber and then supplied from slits provided on an inner periphery wall of the diffusion chamber over the substrate surface. The gas pressure was increased to $10^{-2}$ to $10^{-1}$ Torr. only near the substrate, while the pressure near the evaporation sources which were placed apart from the substrate was increased to about $10^{-4}$ Torr.

Metals Y, Ba and Cu were evaporated from independent evaporation sources at such evaporation rates that the atomic ratio of Y:Ba:Cu was 1:2:3 on the substrate. For example, Y, Ba and Cu were evaporated at rates of 1 Å/sec., 2.3 Å/sec. and 1.7 Å/sec., respectively.

Between the substrate and the evaporation sources, a high-frequency coil was placed, and the high frequency was applied at 100 W so as to generate oxygen plasma which activated the evaporated metals and accelerated the reactions on the substrate.

Under the above conditions, a thin film of $YBa_2Cu_3O_{7-x}$ having a thickness of 1000 Å was formed on the substrate.

In this step, Y and Ba were evaporated by electron beam, and Cu was evaporated by resistance heating. The evaporation conditions were as follows:

Y:

A metal ingot (purity: 99.9 %) (50 g) was used and placed in a crucible cooled with water. The metal was evaporated by the application of an electron beam at an acceleration voltage of 5 KV and a filament current of 400 mA.

Ba:

A metal ingot (purity: 99.9 %) (50 g) was used and evaporated by the application of the electron beam at an acceleration voltage of 5 KV and a filament current of 100 mA.

Cu:

In an alumina crucible around which a tungsten filament was wound, metal Cu particles (particle size of 2 to 3 mm, purity of 99.9999 %) (10 g) were charged and heated by the application of electric current through the filament at 10 V, 30 A.

Then, the substrate temperature was lowered to 305° C, the supply of oxygen over the substrate was stopped and the oxygen pressure in the evaporation vessel was kept in the order of $10^{-4}$ Torr. Thereafter, Mg was evaporated at a rate of 1 Å/sec. to form the MgO layer on the $YBa_2Cu_3O_7$-x thin film as follows:

30 Grams of metal Mg (purity: 99.9 %) was placed in a crucible cooled with water. The metal was evaporated by the application of an electron beam at an acceleration voltage of 5 KV and a filament current of 10 mA.

FIG. 1 is the reflecting high energy electron diffraction (RHEED) photographs of the $YBa_2Cu_3O_{7-x}$ thin film of 1000 Å in thickness and FIGS. 2 through 5 are the RHEED photographs of the MgO layer at thicknesses of 3, 6, 9 and 21 Å, respectively, which confirm that the $YBa_2Cu_3O_{7-x}$ thin film was epitaxially grown with its (001) plane in parallel with the film surface and substantially in the single crystal form, and the MgO layer of 10 Å or less in thickness could be continuously and epitaxially grown with its (001) plane in parallel with the layer surface and was similar to the single crystal form.

Further, the second $YBa_2Cu_3O_{7-x}$ thin film was formed on the MgO layer under the same conditions as above. It was confirmed that the second $YBa_2Cu_3O_{7-x}$ thin film was substantially in the single crystal form and epitaxially grown with the (001) plane in parallel with the film surface.

According to the present invention, the single crystal $YBa_2Cu_3O_{7-x}$ thin film having the (001) plane in the direction parallel with the film surface can be homogeneously covered with the continuous MgO ultrathin layer having a thickness of several Å. The MgO ultrathin layer is epitaxially grown by the present invention and its (001) plane is parallel with the layer surface. Therefore, on the MgO layer, the second single crystal $YBa_2Cu_3O_{7-x}$ thin film can be epitaxially grown to form an element which can be expected to be used as the Josephson tunnel type element.

When the MgO is substantially in the singly crystal form, the $YBa_2Cu_3O_{7-x}$ thin film with better quality can be formed thereon and the formed element is highly expected to be used as the Josephson tunnel element.

What is claimed is:

1. A laminated film comprising a thin film of single crystal $YBa_2Cu_3O_{7-x}$ having a plane in the direction parallel with the film surface and a continuous insulating ultrathin layer of MgO which is formed on said superconductor film and has a thickness of not larger than 10 Å and the (001) plane in a direction parallel with the film surface.

2. The laminated film according to claim 1, wherein the MgO ultrathin layer is in the form of single crystal.

* * * * *